United States Patent
Ceuninck et al.

[11] Patent Number: 6,136,619
[45] Date of Patent: Oct. 24, 2000

[54] METHOD FOR MEASURING ELECTROMIGRATION-INDUCED RESISTANCE CHANGES

[75] Inventors: Ward De Ceuninck, Kermit; Luc De Schepper, Hasselt; Jan Van Olmen, Leuven, all of Belgium; Alessandro Goldoni, Parma, Italy

[73] Assignee: Interuniversitair Micorelektronica Centrum (IMEC, vzw), Leuven, Belgium

[21] Appl. No.: 09/165,486

[22] Filed: Oct. 2, 1998

[30] Foreign Application Priority Data

Oct. 3, 1997 [EP] European Pat. Off. .............. 97870149

[51] Int. Cl.[7] .................................................. H01L 21/66
[52] U.S. Cl. ................................ 438/18; 438/14; 438/17; 438/468; 324/158.1
[58] Field of Search ................................. 438/14, 17, 18, 438/468; 324/522, 523, 525

[56] References Cited

U.S. PATENT DOCUMENTS

| | | | |
|---|---|---|---|
| 5,264,377 | 11/1993 | Chesire et al. | 438/11 |
| 5,497,076 | 3/1996 | Kuo et al. | 324/158.1 |

FOREIGN PATENT DOCUMENTS

| | | | |
|---|---|---|---|
| 0 395 149 | 10/1990 | European Pat. Off. . | |
| 0 656 650 | 6/1995 | European Pat. Off. . | |
| 0 656 650 A1 | 7/1995 | European Pat. Off. | 438/14 |
| 3-077080 | 6/1991 | Japan | 438/14 |

OTHER PUBLICATIONS

European Patent Office Search Report, Application No. EP 97 87 0149.
Scorzoni et al., "Electromigration in thin–film interconnection lines: models, methods and results", *Materials Science Reports*, 7, 142–220 (1991).
Patent Abstracts of Japan, vol. 15, No. 245 (P–1218), Jun. 24 1991 & JP 03 77080 A (Nippon Telegr. & Teleph. Corp.), Apr. 2 1991.

*Primary Examiner*—David Nelms
*Assistant Examiner*—Christian D. Wilson
*Attorney, Agent, or Firm*—McDonnell Boehnen Hulbert & Berghoff

[57] ABSTRACT

A method for measuring resistance changes is described to study electromigration induced failures in conductive patterns. This method can provide a basis for lifetime predictions based on low value failure criteria, i.e. small resistance changes in the conductive patterns in a limited period of time. Two essentially identical so-called test and reference structures are placed close to each other on the same substrate and submitted to at least one sequence of a stress period and a measurement period. During a stress period, a DC current with a high current density is applied to the test structure thereby enhancing electromigration, while substantially simultaneous an AC current is applied to the reference structure leading to the same amount of power dissipation in said reference structure as the amount of power dissipation in said test structure, introduced by said DC stress current. The method of the present invention makes it possible to distinguish in a very accurate way between resistance changes induced by electromigration and resistance changes induced by other disturbances.

10 Claims, 4 Drawing Sheets

METHOD FOR MEASURING ELECTROMIGRATION-INDUCED RESISTANCE CHANGES

REFERENCE TO RELATED APPLICATIONS

This claims priority benefits to European patent application No. 97870149.8 filed Oct. 3, 1997.

FIELD OF THE INVENTION

The present invention is related to a method for evaluating electromigration induced early resistance changes in conductive materials, particularly in interconnect patterns as currently present in integrated circuits. Testing for electromigration during the development and manufacture of integrated circuits is indispensable to ensure a qualified performance during lifetime.

BACKGROUND OF THE INVENTION

The reliability of integrated circuits and particularly of the interconnect patterns being part of these integrated circuits is an important topic in the development, the fabrication and the use of integrated circuits. There are several important disturbances inducing failure in conductive patterns. Examples of such disturbances are electromigration and power dissipation mismatch. These disturbances can occur in any current-driven conductive pattern. The effect of these disturbances on the lifetime of conductive patterns strongly depends on several parameters like e.g. the dimensions of those patterns, the current density and the conductive material used: e.g. Al, Cu or an alloy thereof. Conventional examples of criteria to identify failure in a current driven conductive pattern during lifetime, the so-called high value failure criteria, are a line opening in said conductive pattern or a 10% resistance change. In the past, several conductive test structures were produced in order to determine these failures. The test times needed to meet these conventional failure criteria are far too extensive and therefore these criteria are inadequate especially in the development phase of an IC process where a rapid performance feedback is indispensable.

Performing early resistance change (ERC) measurements is an alternative way to study non-electrical induced failure in conductive patterns. ERC measurements can provide a basis for lifetime predictions based on low value failure criteria making them particularly attractive for use in IC development and fabrication. A straightforward requirement for a good ERC measurement is a high measurement resolution, typically about 20 ppm. In general there are two basic techniques for early resistance change determination: a so-called absolute measurement technique and a so-called bridge technique.

This absolute measurement technique is addressed by e.g. the European patent EP 0395149 A1. This test technique measures the resistance, i.e. the resistance changes, of a conductive pattern during a limited period in an environment with a high temperature stability in a very accurate way. At the beginning of the test the intrinsic resistance of the conductive pattern is measured. A high current density is applied to the conductive pattern in order to enhance electromigration and a plurality of resistance measurements is performed while the test time elapses in order to determine the resistance changes. The major disadvantage of this technique is that one can not distinguish between the different disturbances inducing failure, i.e. it is not possible to distinguish between electromigration and resistance changes induced by temperature changes, i.e. due to power dissipation which can be quite significant at large current densities.

The conventional bridge technique makes use of two identical structures, i.e. two conductive patterns having the same dimensions and the same resistance, hereafter called test and reference which are processed on the same substrate in close vicinity of each other. One reason to implement two different structures can be to correct the measurements on the test structure for the external thermal induced resistance changes. The test structure is then stressed at a high current density, while the reference structure is sensing only a very small measuring current. The measurement on this reference structure is used to correct the measurement on the test structure for the external thermal induced resistance changes (see e.g. A Scorzoni et al, Materials Science Reports 7, p. 143–220, 1991). Another reason to implement two structures as in the United States patent U.S. Pat. No. 5,264,377, can be to correct for the topographic influences but in the latter case the structures are not identical.

One of the obvious disadvantages of the conventional bridge technique is that the measurements are still not corrected properly due to the power dissipation mismatch. The power dissipation in the test structure can be quite substantial because the test structure is sensing a high current density, while the power dissipation in the reference structure is much lower than in the test structure due to a huge difference in current density level. Furthermore because test and reference structure are so close to each other the large temperature increase in the test structure due to the power dissipation will affect the temperature of the reference structure. Consequently, it is still not possible to separate electromigration induced failures from failures induced by other disturbances. These disturbances are mainly thermal processes initiated by thermal changes caused by the power dissipation. Examples of such processes are Joule heating and the reversible and irreversible processes induced in a conductive pattern by Joule heating like e.g. precipitation.

SUMMARY OF THE NVENTION

In an aspect of the invention a method of measuring early resistance changes is disclosed to study electromigration induced failures in conductive patterns. Said method can provide a basis for lifetime predictions based on low value failure criteria, i.e. small resistance changes in said conductive patterns in a limited period of time. Two identical so-called test and reference structures are placed close to each other on the same substrate and submitted to at least one sequence of a stress period and a measurement period. Said identical test and reference structures are in fact two conductive patterns having the same dimensions, the same layout and the same intrinsic resistance. Said structures are composed of the same materials, are at about the same temperature and are processed on the same substrate in vicinity of each other. During said stress period, as illustrated in FIG. 1, a DC high density stress current, which enhances electromigration, is applied to the test structure, while simultaneously a symmetric pulsed AC current, which has no influence on electromigration, is applied to the reference structure. The amplitude of the AC current is chosen such that both the DC current and the AC current result in the same power dissipation in both structures during said stress period. The latter can be achieved by applying currents having the same root mean square (rms) value. Consequently the temperature changes in the reference structure and in the test structure are identical. During said measurement period, as illustrated in FIG. 1, two identical AC currents, i.e. having the same amplitude and frequency, are applied to the reference and test structure respectively. Furthermore said amplitude is the same as the amplitude of the currents during the stress period. Consequently the dissipated power in the reference structure is identical to the dissipated power in the test structure and the temperature changes are identical for both structures. These AC currents do not affect electromigration induced resistance changes. The difference between the resistances, as determined during a measurement period, of the test and the measurement structure is solely determined by electromigration in the test structure.

In another aspect of the invention a method is disclosed allowing to determine resistance changes induced by electromigration. According to the present invention, the currents applied to both the test structure and the reference structure during the stress period(s) as well as during the measurement period(s) are generated by one and the same source. Therefore, drift of said source is also excluded because the resistance changes induced by this drift are identical in both the test structure and the reference structure. Preferably MOSFET switches are implemented to realise this. Such a MOSFET switch, as in FIG. 2, comprises four identical MOSFET's, which can be all n-channel devices as well as p-channel devices. The drains of MOSFET 3 and 4 are connected to the sources of MOSFET's 1 and 2 respectively. The connection from the drain of MOSFET 3 to the drain of MOSFET 4 comprises either one of a test structure or a reference structure. The gates of the MOSFET's can be controlled by a binary signal. If the signal level is high, i.e. Q=1 in FIG. 2, then an inversion channel is created in MOSFET 4 as well as in MOSFET 1, while MOSFET 3 and MOSFET 2 are in OFF-state, which can be accomplished by using an invertor. Therefore, the current flows through MOSFET 4, via the test or reference structure (from a to b) and leaves the switch through MOSFET 1 as the output current $I_{out}$. On the other hand if the signal level is low, i.e. Q=0, the MOSFET's 2 and 3 are in ON-state while the MOSFET's 1 and 4 are in the OFF-state, which can be accomplished by using an invertor. In the latter case, the current is flowing in the opposite direction (from b to a) through either one of a test or reference structure.

Further according to the method of the present invention a single current meter can be applied thereby also excluding the influence of drift of the current meter on the measurement results.

In another aspect of the invention a method for determining resistance changes induced by electromigration in a conductive pattern is disclosed, comprising at least one sequence of the steps of:

applying substantially simultaneous a first unidirectional current to a first conductive pattern and a second alternating symmetric current to a second conductive pattern, said first and said second conductive pattern being essentially identical and placed on the same substrate, said first current and said second current thereby leading to substantially the same amount of power dissipation in said first conductive structure and said second conductive structure respectively;

measuring the resistance changes of said first conductive pattern and said second conductive pattern by applying substantially simultaneous a third alternating current to said first conductive pattern and a fourth alternating current to said second conductive pattern, said third current and said fourth current thereby leading to substantially the same amount of power dissipation in said first conductive structure and said second conductive structure respectively.

DETAILED DESCRIPTION OF THE INVENTION

In relation to the appended drawings the present invention is described in detail in the sequel. Several embodiments are disclosed. It is apparent however that a person skilled in the art can imagine several other equivalent embodiments or other ways of practising the present invention, the spirit and scope thereof being limited only by the terms of the appended claims.

In an embodiment of the invention a method of measuring early resistance changes is disclosed to study non-electrical induced failures in conductive patterns. Said method can provide a basis for lifetime predictions based on low value failure criteria, i.e. small resistance changes in said conductive patterns in a limited period of time. Particularly, the method of the present invention allows one to distinguish in a very accurate way between electromigration induced failures and failures induced by other disturbances like temperature changes due to Joule heating, external temperature fluctuations, reversible and irreversible processes induced in the conductive patterns by Joule heating.

According to the method of the present invention two essentially identical so-called test and reference structures are placed close to each other and submitted to at least one sequence of a stress period and a measurement period. Said essentially identical test and reference structures are in fact two conductive patterns having substantially the same characteristics, like e.g. the same dimensions, the same layout and the same intrinsic resistance. Said structures are composed of the same materials, are at about the same temperature and are placed on the same substrate in close vicinity of each other.

Figure 1:
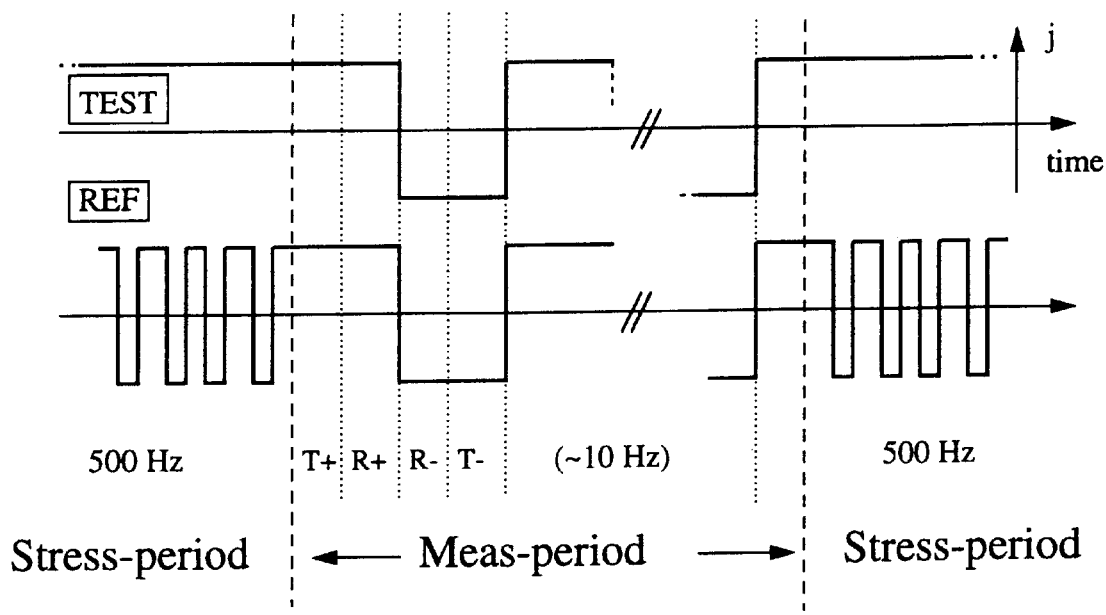
FIG. 1 represents a schematic diagram of the signals applied to both a test and a reference structure, i.e. the current density versus elapsing time, according to an embodiment of the invention. Said test and reference structures are two essentially identical conductive patterns placed on the same substrate.

During said stress period, as illustrated in FIG. 1, a DC high density stress current is applied to the test structure, while simultaneously a symmetric pulsed AC current, typically with a frequency between 100 Hz and 10 kHz, is applied to the reference structure. The amplitude of the AC current is chosen such that the dissipated power in both the test and reference structure is the same. The latter can be achieved by choosing the same rms value for the DC and the AC current. Consequently the temperature changes in the test and reference structure are identical for both structures. Because the DC current is a unidirectional current and because the DC current density is chosen high enough to guarantee accelerated ageing, electromigration is enhanced in the test structure and thus also the resistance changes induced by electromigration. The applied DC current density is typically about 1 MA per cm$^2$ or higher. On the other hand the bi-directional symmetric AC current in the reference structure does not introduce electromigration.

During said measurement period, as illustrated in FIG. 1, two identical symmetric AC currents, i.e. having the same amplitude and frequency, are applied to the reference and test structure respectively. Furthermore said amplitude is the same as the amplitude of the currents during the stress period to thereby ensure a constant temperature of both test and reference structure during the whole experiment. Consequently the dissipated power in the reference structure is identical to the dissipated power in the test structure and the temperature changes are identical for both structures. As stated before an AC current does not affect electromigration induced resistance changes. Each measurement cycle within a measurement period comprises in practice a sequence of four resistance measurements: T+, R+, R−, T− as illustrated in FIG. 1. Therefore, during said measurement cycle, the resistance of both the reference structure (R+, R−) and the test structure (T+, T−) is measured twice. The latter is performed in order to enhance the accuracy of the determination of the resistance changes induced by disturbances. So by using the method of the present invention the only difference between the test structure and the reference is the difference in resistance induced by electromigration which is introduced in the test structure during the stress period. All other disturbances inducing resistance changes are corrected for by subtracting the resistance value of the reference structure from the resistance value of the test structure as determined during the measurement period.

In another embodiment of the invention a method is disclosed allowing to distinguish in a very accurate way between electromigration induced failures and failures induced by other disturbances like temperature changes due to Joule heating, external temperature fluctuations, reversible and irreversible processes induced in the conductive patterns by Joule heating. Furthermore the currents applied to both the test structure and the reference structure during the stress period(s) as well as during the measurement period(s) are generated by one and the same source. Therefore, drift of said source is also excluded because the resistance changes induced by this drift are identical in both the test structure and the reference structure.

Figure 2:
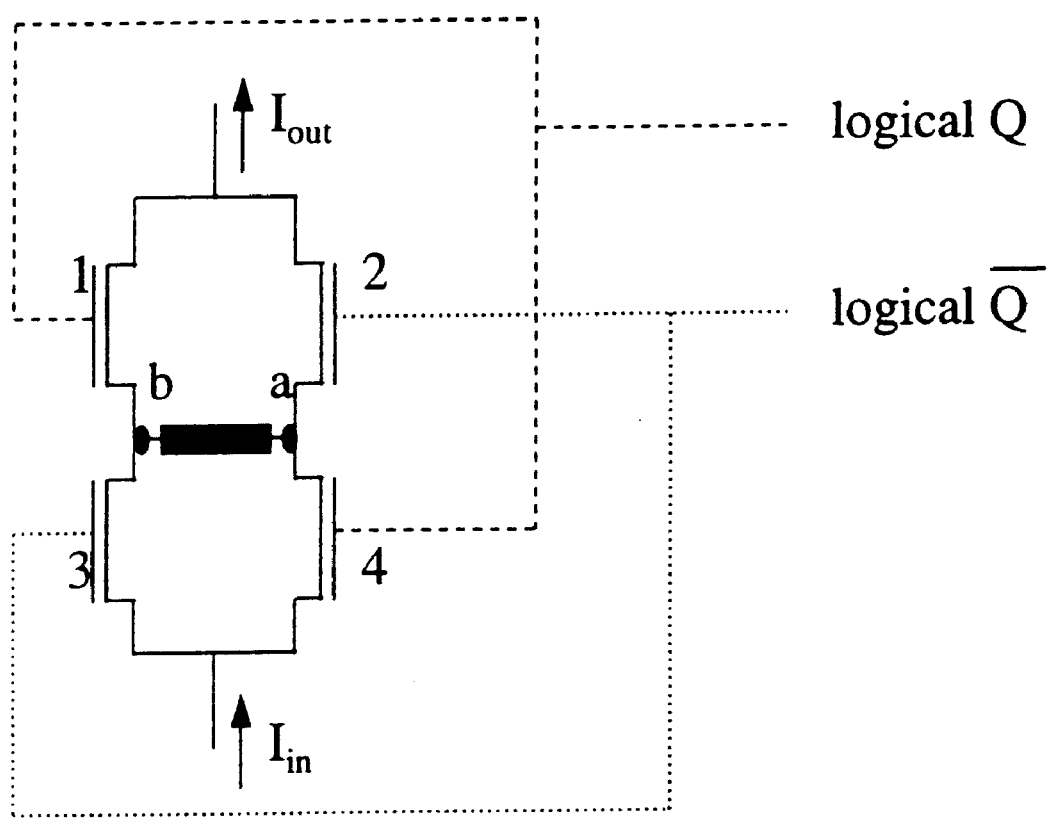
FIG. 2 represents a MOSFET switch which can be used to obtain an alternating current in either one of a test or reference structure according to an embodiment of the invention.

There are several possibilities known to a person skilled in the art to generate two identical AC currents, as during a measurement period, or to generate a DC current and an AC current having the same rms value, as during a stress period, from a single current source. According to the method of the invention, preferably MOSFET switches are implemented to achieve this. Such a MOSFET switch, as in FIG. 2, comprises four identical MOSFET's, which can be all n-channel devices as well as p-channel devices. Said MOSFET's have the same dimensions and are characterised by the same electrical parameters. The drains of MOSFET 3 and 4 are connected to the sources of MOSFET's 1 and 2 respectively. The connection from the drain of MOSFET 3 to the drain of MOSFET 4 comprises either one of a test structure or a reference structure. The gates of the MOSFET's can be controlled by a binary signal. If the signal level is high, i.e. Q=1 in FIG. 2, then an inversion channel is created in MOSFET 4 as well as in MOSFET 1, while MOSFET 3 and MOSFET 2 are in OFF-state, which can be accomplished by using an invertor. Therefore, the current flows through MOSFET 4, via the test or reference structure (from (a) to (b)) and leaves the switch through MOSFET 1 as the output current $I_{out}$. The resistance can be determined by measuring the output current and the voltage drop between (a) and (b). On the other hand if the signal level is low, i.e. Q=0, the MOSFET's 2 and 3 are in the ON-state while the MOSFET's 1 and 4 are in the OFF-state, which can be accomplished by using an invertor. In the latter case, the current is flowing in the opposite direction (from b to a) through either on of the test or reference structure.

Figure 3:
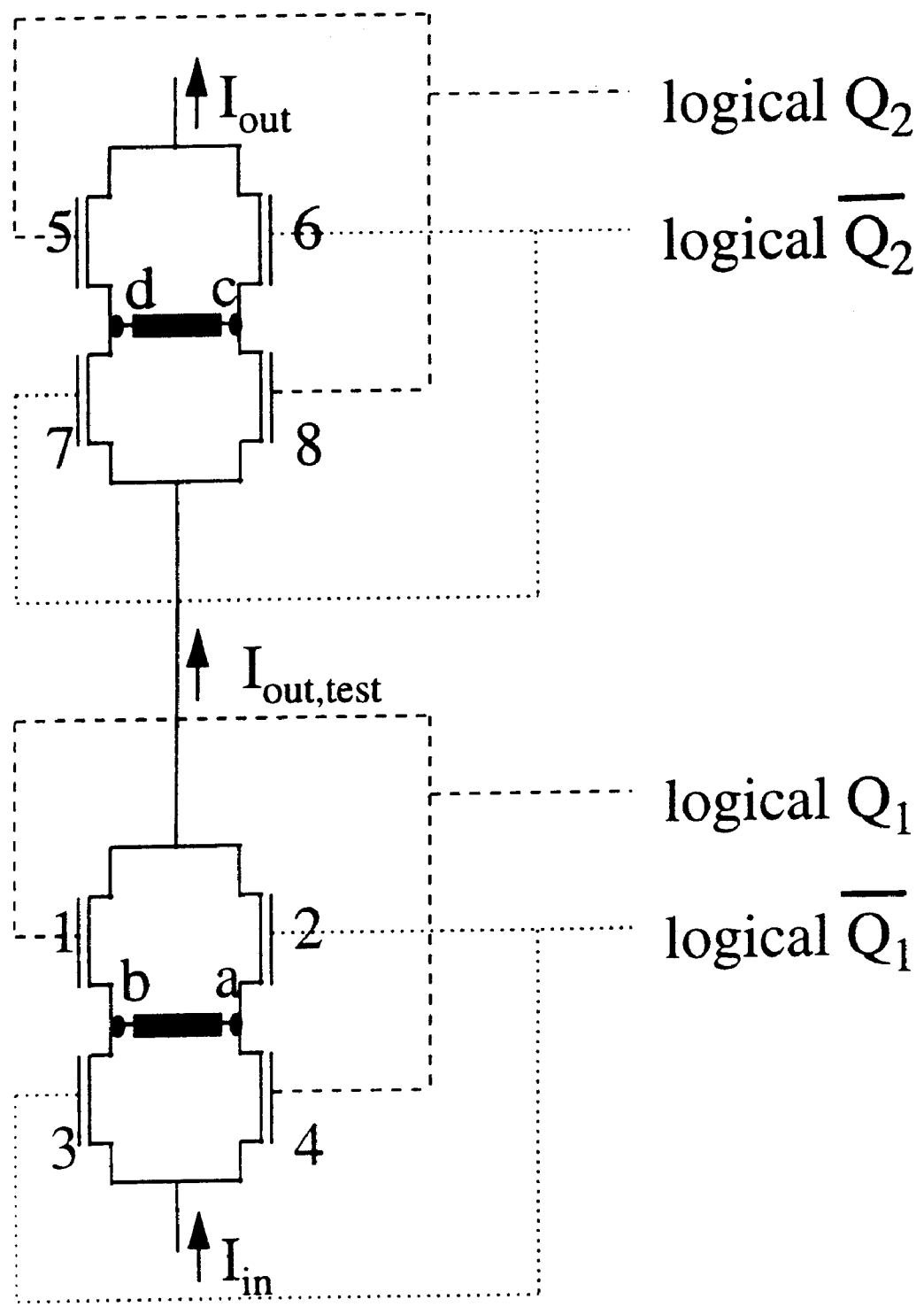
FIG. 3 represents an exemplary scheme, according to an embodiment of the invention, of two MOSFET switches which can generate a DC current as well as an AC current having the same rms value out of a single DC current source as used during a stress period.

By putting two of these MOSFET switches in series and by applying multiple control signals to control these switches at least one sequence of a stress period and a measurement period can be carried out using only one DC current source for both the test and the reference structure. During the stress period the test structure requests for a DC current, while a AC current yielding the same power dissipation is requested for the reference structure. A single DC current source generates one DC current which is fed into the input ($I_{in}$, FIG. 3) of a first MOSFET switch. When the control signal level of this first switch is chosen high, MOSFET's 4 and 1 are in the ON-state, while MOSFET 3 and MOSFET 2 are in OFF-state, which can be accomplished by inverting the control signal. Therefore, the current flows through MOSFET 4, via the test structure (from a to b) and leaves the switch through MOSFET 1 as the unidirectional output current $I_{test}$. The control signal level is kept high during the whole stress period. This DC current $I_{test}$ is fed in to a second MOSFET switch, comprising four identical MOSFET's and a reference structure, which is connected in series with said first MOSFET switch. When the signal level of the control signal is high, i.e. $Q_2$=1 in FIG. 3, then the MOSFET's 5 and 8 are in the ON-state, while MOSFET 6 and 7 are in OFF-state, which can be accomplished by inverting the control signal. Therefore, the current flows through MOSFET 8, via the reference structure (from (c) to (d)) and leaves the switch through MOSFET 5 as the output current $I_{out}$. On the other hand if the signal level is low, i.e. $Q_2$=0, the MOSFET's 6 and 7 are in the ON-state while the MOSFET's 5 and 8 are in the OFF-state, which can be accomplished by using an invertor. In the latter case, the current is flowing in the opposite direction (from (d) to (c)) through the reference structure. By doing so a symmetric alternating current is generated in the reference structure. The frequency of this current is correlated to the switching speed of the MOSFET switch, i.e. the frequency of the binary control signal. The same MOSFET switches can be used in an analogous way, i.e. by applying multiple control signals, to provide two identical AC currents during a measurement period. Said AC currents having the same amplitude as the currents during the stress period. The resistance values of the test structure and the reference structure can be determined by measuring the current and the voltage drop over the test structure (between (a) and (b)) and the reference structure (between (c) and (d)).

According to the method of the present invention the so-called test and reference structures are submitted to at least one sequence of a stress period and a measurement period. Said identical test and reference structures are in fact two conductive patterns having the same dimensions, the same layout and the same intrinsic resistance. Said structures are composed of the same materials and are processed on the same substrate. Particularly, said conductive patterns can be metal stripes or metal multi-finger structures. Furthermore said conductive patterns can comprise a single conductive layer or multiple conductive layers. Said conductive layer can be a metal like Al, Cu, Au or an alloy thereof. Said conductive layers can be passivated or not.

In a detailed embodiment of the invention an experimental example of a measurement of the resistance changes is disclosed. The two conductive patterns, the so-called test and reference structures, are two non-passivated metal patterns comprising four layers: a first Al layer, with 1 weight percentage (wt %) Si and 0.5 wt % Cu, a Ti barrier layer, Ti and TiN ARC layers. These patterns are processed on the same substrate, i.e. a silicon substrate covered with $SiO_2$. These patterns each have the same dimensions. Their length is 2 mm, the width is 10 micrometer, the thickness of the AlSiCu layer, the Ti barrier layer, the Ti ARC layer and the TiN Arc layer are respectively 4400, 500, 200 and 600 Angstrom. The sequence of stress and measurement periods is performed at an external ambient temperature of 220 deg ° C. During the test period a DC current with a current density of 3 $MA/cm^2$ is applied to the test structure, while an AC current is applied to the reference structure. Said AC current, having a frequency of 100 Hz is chosen such that the dissipated power in the reference structure is the same as the dissipated power in the test structure. During the measurement period both the test and reference structure are sensing the same current, having a period of 80 ms. The power dissipation associated with each of these currents is the same as during the stress period.

Figure 4:
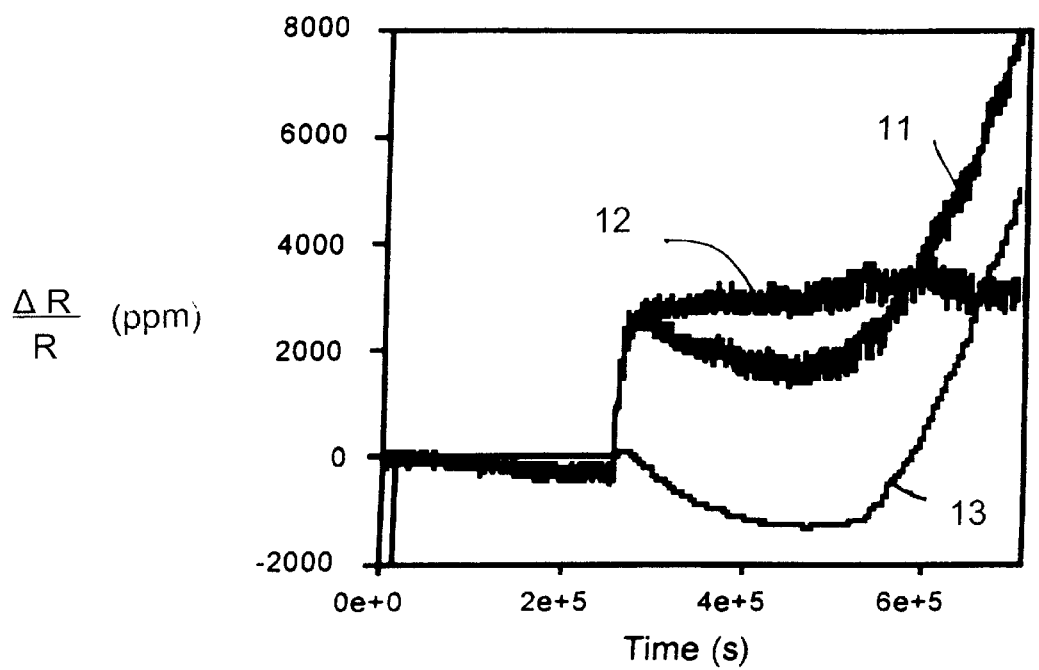
FIG. 4 represents, according to a particular embodiment of the invention, the relative resistance changes versus time. The measurements are performed on an Al sample, with 1 weight percentage (wt %) Si and 0.5 wt % Cu, at an ambient temperature of 220° C.

The equipment used for performing the measurements of resistance changes is: a multimeter (Keithley 2001) for measuring the current and the voltage drop over either one of a test or a reference structure, an in-house built current source, control circuitry e.g. for controlling the MOSFET switches, a furnace (own design gas-flow type furnace with a temperature stability of about 0.01° C.). The test and reference structure were processed on the same substrate at a distance of 500 micrometer from each other. A part of said substrate, comprising both the test and the reference structure was mounted in a DIL24 ceramic package. The measurement resolution of the non-corrected signals measured on the test and reference structure, being in fact the measurement resolution of an absolute measurement, is about 400 ppm, while the measurement resolution of the corrected, i.e. corrected for resistance changes induced by disturbances besides electromigration, signal, being in fact the measurement resolution of a so-called bridge measurement, is about 2 ppm. As can be seen at FIG. 4 no artefacts are induced by this so-called bridge correction. In the first part of the relative resistance change, no stress current was applied. The test and reference structure were in a furnace at 220° C. Both the test (FIG. 4, (11)) and the reference signals (12) are about the same, i.e. a decrease of about 500 ppm, resulting in a corrected signal (13) that remains constant around zero until a stress current with a current density of 3 $MA/cm^2$ is applied at the test structure after 225000 seconds. Initially the resistance changes of the test and reference structure show the same non-linear increase of about 3000 ppm; the resistance changes of the reference structure then saturate towards the end of the measurement sequence. The resistance changes of the test structure initially follow the behaviour of the resistance changes of the reference structure but then start to decrease before rising quasi-linearly. The corrected resistance changes are only those induced by electromigration: after applying the stress current the corrected resistance changes almost immediately start to decrease before increasing monotonically. Some important aspects are revealed by this picture like the resolution improvement (when comparing the smoothness of the test and reference signal with the smoothness of the corrected signal), the elimination of the resistance changes which are not induced by electromigration.

What is claimed:

1. A method for determining resistance changes induced by electromigration in a conductive pattern, comprising at least one sequence of the steps of:

applying substantially simultaneous a first unidirectional current to a first conductive pattern and a second alternating symmetric current to a second conductive pattern, said first and said second conductive pattern being essentially identical and placed on the same substrate, said first current and said second current thereby leading to substantially the same amount of power dissipation in said first conductive structure and said second conductive structure respectively;

measuring the resistance changes of said first conductive pattern and said second conductive pattern by applying substantially simultaneous a third alternating current to said first conductive pattern and a fourth alternating current to said second conductive pattern, said third current and said fourth current thereby leading to substantially the same amount of power dissipation in said first conductive structure and said second conductive structure respectively.

2. A method as recited in claim 1 wherein said first current and said third current lead to substantially the same amount of power dissipation in said first conductive structure.

3. A method as recited in claim 1 wherein the average current of said second and said third and said fourth current is zero.

4. A method as recited in claim 1 wherein said first and said second conductive pattern have the same dimensions, the same layout, the same intrinsic resistance and are composed of the same materials.

5. A method as recited in claim 1 wherein said substrate is either one of a slice of an insulating material or at least a part of a semiconductor wafer being covered with an insulating layer.

6. A method as recited in claim 1 wherein said conductive pattern is a single conductive stripe comprising at least one conductive layer.

7. A method as recited in claim 6 wherein said conductive layer is selected from the group of aluminum, copper, gold, an aluminum alloy, a copper alloy.

8. A method as recited in claim 1 wherein said first, said second, said third and said fourth current are originating from one DC current generated out of a single DC current source.

9. A method as recited in claim 8 wherein said one DC current, being generated by a single DC source, is applied to a first and a second MOSFET switch, said first MOSFET switch comprising four essentially identical MOSFET's and said first conductive pattern, said second MOSFET switch comprising four essentially identical MOSFET's and said second conductive pattern, said first MOSFET switch and said second MOSFET switch being connected in series and further comprising means for controlling said switches.

10. A method as recited in claim 9 wherein said MOSFET's have the same dimensions and are characterised by the same electrical parameters.

* * * * *